United States Patent
Sato et al.

(10) Patent No.: US 7,102,170 B2
(45) Date of Patent: Sep. 5, 2006

(54) DISPLAY DEVICE

(75) Inventors: Hideo Sato, Hitachi (JP); Shigeyuki Nishitani, Mobara (JP); Tomohiko Sato, Fujisawa (JP); Mutsuko Hatano, Kokubunji (JP)

(73) Assignee: Hitachi Displays, Ltd., Mobara (JP)

( * ) Notice: Subject to any disclaimer, the term of this patent is extended or adjusted under 35 U.S.C. 154(b) by 178 days.

(21) Appl. No.: 10/743,706

(22) Filed: Dec. 24, 2003

(65) Prior Publication Data

US 2004/0135150 A1 Jul. 15, 2004

(30) Foreign Application Priority Data

Dec. 26, 2002 (JP) .................................... 2002-377290

(51) Int. Cl.
*H01L 29/04* (2006.01)

(52) U.S. Cl. .............................. 257/75; 257/66; 257/72

(58) Field of Classification Search .................. 257/72, 257/59, 75, 74, 70, 66
See application file for complete search history.

(56) References Cited

U.S. PATENT DOCUMENTS 6,797,550 B1 9/2004 Kokubo et al.
2003/0186490 A1 10/2003 Kato et al.

FOREIGN PATENT DOCUMENTS

WO 97/45827 12/1997

OTHER PUBLICATIONS

M. Hatano, et al., "12.4L : Late–News Paper : Selectively Enlarging Laser Crystallization Technoloby for High and Uniform Performance Poly–Si TFTs"; SID 02 Digest, pp. 158–161.

M. Hatano, et al., "12.4L: Late–News Paper: Selectivity Enlarging Laser Crystallization Technoloby for High and Uniform Performance Poly–Si TFTs"; SID 02 Digest, pp. 158–161.

*Primary Examiner*—Sara Crane
(74) *Attorney, Agent, or Firm*—Antonelli, Terry, Stout and Kraus, LLP.

(57) ABSTRACT

The irregularities of characteristics of a pair of transistors, which are prepared by a pseudo single crystallizing technique, are reduced. To achieve this, semiconductor layers are formed on a substrate and have pseudo single crystal regions therein, and a plurality of thin film transistors are arranged inside of the pseudo single crystal regions. Two or more of the plurality of thin film transistors, which are required to exhibit small irregularities relative to each other as characteristics thereof, have the direction of the length of the gates of the respective thin film transistors arranged at an inclination of within ±20 degree with respect to the longitudinal direction of the strip-like grown crystals, and they are arranged such that, when channel regions of respective thin film transistors are imaginarily extended in parallel to the growth direction of the strip-like grown crystals, at least portions of the channel regions are superposed on each other.

9 Claims, 6 Drawing Sheets

DISPLAY DEVICE

BACKGROUND OF THE INVENTION

The present invention relates to a display device, and, more particularly, to a method of arranging a plurality of transistors, which are prepared by a pseudo single crystallization technique (SELAX: Selectively Enlarging LAser X'tallization or a method similar to SELAX), for example, a pair of transistors, in a display device.

A TFT (Thin Film Transistor) type liquid crystal display module has been popularly used as a display device in a notebook type personal computer and the like. As an example of such a liquid crystal display module, there is a known display module which employs thin film transistors (TFT) formed on polysilicon.

On the other hand, there is a technique which recystallizes polysilicon or amorphous silicon in the lateral direction (direction parallel to a substrate) using laser beams, so as to increase the particle size thereof (see brochure of International Publication 97/45827 (hereinafter referred to as a patent literature 1) and Society for Information Display 2002 (SID 02) DIGEST pp. 158–161 (hereinafter referred to as a non-patent literature 1)). For example, it has been reported that, by forming thin film transistors on a semiconductor (silicon) layer, which is formed by a method described in the above-mentioned non-patent literature 1, the mobility ($\mu$) can be enhanced about three times compared to thin film transistors formed on a usual polysilicon film.

FIG. 11 is a diagram illustrating a pseudo single crystallization method of forming polycrystalline silicon using laser beams, as described in the above-mentioned non-patent literature 1.

In this method, laser beams 4 are irradiated to a polycrystalline silicon film 2, that has been formed on a glass substrate 1, while scanning the glass substrate 1 in the direction of the arrow A shown in FIG. 11. As the laser beams 4, continuous (CW: Continuous Wave) laser beams are used.

Due to this laser beam irradiation, the temperature of the polycrystalline silicon film 2 is elevated, and, hence, the polycrystalline silicon film 2 is melted. Then, when the irradiation advances to the next position, the temperature of the polycrystalline silicon film 2 is again lowered so that the polycrystalline silicon film 2 is recrystallized, whereby a polycrystalline film is formed, in which the particles thereof are of large size, in a thin strip shape in the lateral direction.

Hereinafter, in this specification, this polycrystalline film is defined as a pseudo single crystal region 3. However, the method of forming the pseudo single crystal region 3 is not limited to the method described in the non-patent literature 1, and a polycrystalline film which has been formed by another method, which is similar to the method described in the non-patent literature 1, is also to be included in the definition of the pseudo single crystal region 3.

Since such melting and recrystallization tends to advance in a direction opposite to the scanning direction (the direction of the arrow A shown in FIG. 11) on the glass substrate 1, the crystal growth direction (the direction of an arrow B shown in FIG. 11) of the pseudo single crystal region 3 assumes a direction parallel to and opposite to the scanning direction on the glass substrate 1.

In this recrystallization, the laser beams are converted into linear beams that are elongated in the Y direction using a beam expander. The laser irradiation intensities in the X direction and the Y direction during such an operation are shown in FIG. 12 and FIG. 13. In FIG. 12 and FIG. 13, the axis of abscissas indicates the position and the axis of ordinates indicates the laser beam intensity.

The laser beam intensity distribution in the X direction exhibits a substantially Gaussian distribution, while the laser beam intensity distribution in the Y direction generates a slight difference in intensity within a crystallization range between Y1–Y2 (a range indicated by C shown in FIG. 13), and the state of crystallization is changed in response to the difference in intensity. Further, even when the distribution of the intensity of the laser beam at the position in the Y direction is fixed, there arises the following drawback.

That is, in view of the fact that it is difficult to continue the growth of crystals in the lateral direction over an extremely long region, the following case exists. That is, in the course of the formation of the pseudo single crystal region 3, the irradiation of the laser beams 4 to the polycrystalline silicon film 2 is prevented, or the intensity of the laser beams 4 is decreased, so as to stop the growth of the crystals in the lateral direction temporarily. Then, at the position spaced away from one pseudo single crystal region 3, which is already formed, the laser beams having a given intensity are again irradiated to form another pseudo single crystal region 3 at another position separate from the previous position.

Further, although the laser beams 4 have a shape which is elongated in the direction (Y direction) which crosses the scanning direction (X direction), rather than being elongated in the scanning direction, the length in the Y direction is extremely small compared to the size of the substrate, such as the glass substrate 1. Accordingly, there may be a case in which, by performing reciprocating scanning, while shifting the position in the Y direction each time the scanning reaches an end of the glass substrate 1, another pseudo single crystal region 3 is formed at a position different from the previous position.

In this manner, when the pseudo single crystal regions 3 are formed at a plurality of positions two or more times separately, there may be a case in which the state of the crystallization differs delicately for every formed pseudo single crystal region 3, or a case in which the characteristics of the thin film transistor formed on the pseudo single crystal region 3 differs for every pseudo single crystal region 3.

By forming the thin film transistor on the semiconductor layer formed by the method described in the abovementioned non-patent literature 1, it is possible to prepare a liquid crystal display module which incorporates peripheral circuits, such as drive circuits therein. In such a liquid crystal display module which incorporates the peripheral circuits therein, a reference voltage generating circuit for a digital/analogue converting circuit (DAC) incorporated in the liquid crystal display module is necessary, or a differential amplifying circuit is necessary for buffer amplifiers, which are provided to respective drain signal lines.

The differential amplifying circuit requires a pair of transistors which agree in the transistor characteristics thereof (or exhibit a small relative error in transistor characteristics, thus having a favorable matching).

However, as mentioned previously, in the abovementioned non-patent literature 1, depending on the intensity distribution of the laser beams used for recrystallization, the pair of transistors delicately differ in the crystallized state thereof, and, hence, there arises a drawback in that the relative error in the characteristics of the pair of transistors which are formed on the recystallized silicon layer is increased.

Accordingly, there has been a case in which a thin film transistor which is formed on a semiconductor layer by the method described in the previously-mentioned non-patent literature 1 gives rise to a problem when the transistor is applied to an analogue circuit which is required to have high accuracy, such as a buffer amplifier for a drain driver, which is required to exhibit an offset voltage of several mV or the like.

Further, the occurrence of the drawbacks explained heretofore is not limited to the pseudo single crystallization technique described in the non-patent literature 1, and the drawbacks may arise in a case in which the pseudo single crystal region 3 in which the elongated strip-like crystals grow in the lateral direction is formed using other similar pseudo single crystallization techniques. This is because these cases are common with respect to irregularities of the intensity distribution of the laser beams 4 in the direction (Y direction) which intersects the scanning direction (X direction), or with respect to the irregularities of the crystallized state when the separated pseudo single crystal regions 3 are formed at the plurality of positions.

The drawbacks attributed to such causes are hardly apparent when the particle size of the polycrystal is small, since the irregularities of th characteristics are made uniform due to the presence of a large number of polycrystals in respective thin film transistors. However, when the elongated strip-like crystals are grown in the lateral direction, the number of the crystals present in respective thin film transistors becomes small, and, hence, the irregularities become apparent.

The present invention has been made to overcome the above-mentioned drawbacks of the related art, and it is an object of the present invention to provide a display device in which the irregularities of characteristics of a pair of transistors, which are formed by a pseudo single crystallizing technique and are used in a differential amplifying circuit or the like, have been reduced.

The abovementioned and other objects and novel features of the present invention will become apparent from the description provided in this specification and from the attached drawings.

A summary of representative aspects of the invention disclosed in this specification will be set forth as follows.

The present invention is directed to a display device which includes a semiconductor layer formed on a substrate and a plurality of thin film transistors having semiconductor layers, wherein a semiconductor layer includes a first pseudo single crystal region and a second pseudo single crystal region which is formed at a position separated from the first pseudo single crystal region; and, of the plurality of thin film transistors, two or more thin film transistors, which are required to exhibit small irregularities relative to each other as characteristics of the transistors, are arranged in the same pseudo single crystal region.

Further, the present invention is also directed to a display device which includes semiconductor layers formed on a substrate and having pseudo single crystal regions and a plurality of thin film transistors arranged inside of the pseudo single crystal regions, wherein in a pseudo single crystal region, the semiconductor includes crystals which are grown in an elongate strip-like shape in the direction parallel to the substrate; and, of the plurality of thin film transistors, two or more thin film transistors, which are required to exhibit small irregularities relative to each other as characteristics of the transistors, have the direction of the length of the gates of the respective thin film transistors arranged with an inclination of within ±20 degree with respect to the longitudinal direction of the strip-like grown crystals, and they are arranged such that, when channel regions of the respective thin film transistors are imaginarily extended in parallel in the growth direction of the strip-like grown crystals, at least portions of the channel regions are superposed on each other.

Further, in accordance with the present invention, the rate of the superposition of the regions is 50% or more, and preferably 80% or more.

Further, the present invention is directed to a display device which includes semiconductor layers formed on a substrate and having pseudo single crystal regions and a plurality of thin film transistors arranged inside of the pseudo single crystal regions, wherein in the pseudo single crystal region, the semiconductor includes crystals which are grown in an elongate strip-like shape in the direction parallel to the substrate; and, of the plurality of thin film transistors, two or more thin film transistors, which are required to exhibit small irregularities relative to each other as characteristics of the transistors, have the direction of the length of the gates of the respective thin film transistors arranged with an inclination of within ±20 degree with respect to the longitudinal direction of the strip-like grown crystals, and they are arranged such that th directions of currents which flow in the respective thin film transistors are aligned with each other.

Here, two or more thin film transistors, which are required to exhibit small irregularities relative to each other as characteristics of the transistors, are formed of a differential pair of transistors which constitute a differential amplifying circuit, a pair of transistors of an active load circuit which constitute a differential amplifying circuit, or a pair of transistors of an active load circuit which constitutes a differential amplifying circuit and a transistor having a gate thereof, to which an output voltage of the active load circuit is applied.

Further, two or more thin film transistors, which are required to exhibit small irregularities relative to each other as characteristics of the transistors, are formed of a pair of transistors which constitute a current mirror circuit, or a plurality of transistors which are connected in parallel to each other and equivalently constitute one transistor.

DESCRIPTION OF THE PREFERRED EMBODIMENTS

Hereinafter, various embodiments of the present invention will be explained in detail in conjunction with the drawings.

Here, in all the drawings, parts which have the same functions are indicated by the same symbols, and their repeated explanation is omitted.

Figure 1:
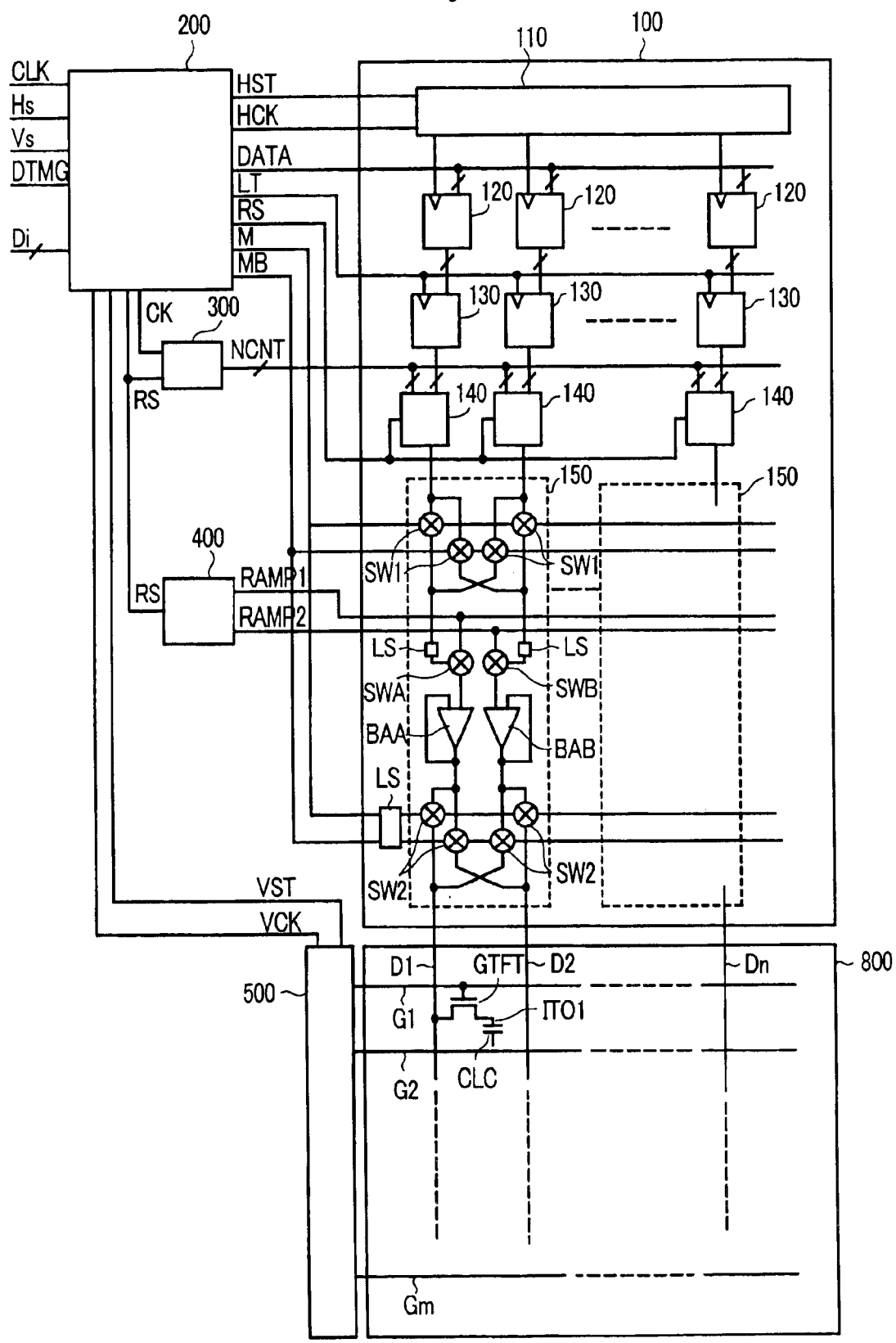
FIG. 1 is a block diagram showing a liquid crystal display device according to an embodiment of the present invention.

FIG. 1 is a block diagram showing a liquid crystal display device according to an embodiment of the present invention. The liquid crystal display device of this embodiment includes a semiconductor layer prepared by the previously-mentioned pseudo single crystallizing technique (for example, SELAX).

The liquid crystal display device of this embodiment includes a drain driver 100, a timing control circuit 200, a reference data generating circuit 300, a ramp voltage generating circuit 400, a gate driver 500 and a display part 800.

In the display part 800, a plurality of pixels, which are arranged in a matrix array, are formed by drain signal lines D, which supply a video signal voltage to respective pixels, and gate signal lines G which supply a scanning signal voltage to the respective pixels. Each pixel includes a pixel transistor (GTFT), which is constituted of a thin film transistor, and the pixel transistor (GTFT) is connected between a drain signal line D and a pixel electrode (ITO1), and a gate thereof is connected to a gate signal line G. Between the pixel electrode (ITO1) and a counter electrode (also referred to as "common electrode" not shown in the drawing), liquid crystal is sealed, and, hence, a pixel capacity (CLC) is equivalently connected between the pixel electrode (ITO1) and the counter electrode. Here, in FIG. 1, for the sake of brevity of the illustration, only one thin film transistor (GTFT) is shown.

The drain driver 100 is constituted of a shift register 110, a latch circuit 120, a latch circuit 130, a comparator 140 and a sample holding circuit 150.

The timing control circuit 200 receives a clock signal (CLK), a horizontal synchronous signal (Hs), a vertical synchronous signal (Vs), a display timing signal (DTMG) and display data (Di) as input signals, and it generates signals which control the drain driver 100, the reference data generating circuit 300, the ramp voltage generating circuit 400 and the gate driver 500.

Hereinafter, a method of driving the liquid crystal display device of this embodiment will be explained.

In general, for preventing the degradation of the liquid crystal, the liquid crystal display device adopts an alternating driving method. In the liquid crystal display device of this embodiment, as the alternating driving method, a dot inversion method is adopted. This dot inversion method is a driving method in which video signals which are applied to the pixels which are arranged close to each other assume polarities opposite to each other in the row direction, as well as in the column direction.

The shift register 110 is operated in response to a start signal (HST) and a clock signal (HCK) transmitted from the timing control circuit 200, and it outputs a multi-phase pulse which controls the latch circuit 120. The latch circuit 120, in response to this multi-phase pulse, sequentially holds the display data (DATA) transmitted from the timing control circuit 200, one after another, for one horizontal scanning line.

Upon receiving a timing signal (LT), which is indicative of the completion of transfer of display data for one horizontal scanning line, from the timing control circuit 200, the latch circuit 130 simultaneously holds the display data of the latch circuit 120 at the same timing.

The comparator 140 compares th quantity of display data held by the latch circuit 130 and the quantity of the reference data (NCNT) which is transmitted from the reference data generating circuit 300. To be more specific, the comparator 140 is initialized in response to an initializing signal (RS) transmitted from the timing control circuit 200 and, thereafter, outputs a High level (hereinafter referred to as "H level") when the reference data (NCNT) is smaller than the display data or equal to the display data.

The reference data generating circuit 300 is an up counter which receives the clock signal (CK) and the initializing signal (RS) transmitted from the timing control circuit 200 as inputs.

The sample holding circuit 150 receives an output of the comparator 140, the alternating signals (M, MB), and outputs (RAMP1, RAMP2) of the ramp voltage generating circuit 400 as inputs and outputs a pixel drive voltage to the drain signal lines D on the display part 800. Here, the alternating signal (M) and the alternating signal (MB) are logic signals which control the polarity of the video signal voltage applied to the pixel electrode of the display part 800, and they have the relationship of inversion, and, hence, their logics are inverted for every line or for every frame.

The output (RAMP1) of the ramp voltage generating circuit 400 is a ramp voltage of positive polarity and the output (RAMP2) of the ramp voltage generating circuit 400 is a ramp voltage of negative polarity. With respect to respective ramp voltages of the output (RAMP1) and the output (RAMP2), their absolute values of inclination are set to be equal to each other. The sample holding circuit 150 includes a buffer amplifier (BAA) which amplifies the ramp voltage (RAMP1) of positive polarity and a buffer amplifier (BAB) which amplifies the ramp voltage (RAMP2) of negative polarity.

In this embodiment, the drain signal lines D are driven by the buffer amplifiers, and, hence, the fluctuation of the load of the ramp voltage generating circuit 400 attributed to the display images can be suppressed, whereby it is possible to display images of high quality. Here, the buffer amplifier (BAA) and the buffer amplifier (BAB) are provided for every two neighboring drain signal lines (for example, the drain signal line (D1) and the drain signal line (D2) shown in FIG. 1), wherein two drain signal lines use the buffer amplifier (BAA) and the buffer amplifier (BAB) in common.

Accordingly, in this embodiment, to the sample holding circuit 150, outputs of two comparators 140 which correspond to two neighboring drain signal lines are inputted. Then, due to the operation of switching elements (SW1), which are controlled in response to the alternating signals (M, MB), an output of one comparator 140 is outputted to a switching element (SWA) which samples the ramp voltage (RAMP1) of positive polarity or a switching element (SWB) which samples the ramp voltage (RAMP2) of negative polarity. Simultaneously, an output of another comparator 140 is outputted to the switching element (SWB) or the switching element (SWA).

Further, due to the operation of switching elements (SW2), which are controlled in response to the alternating signals (M, MB), an output of the buffer amplifier (BAA) which amplifies the ramp voltage (RAMP1) of positive polarity is outputted to one drain signal line or another drain signal line, and, at the same time, an output of the buffer amplifier (BAB) which amplifies the ramp voltage (RAMP2) of negative polarity is outputted to another drain signal line or one drain signal line.

For example, with respect to the case shown in FIG. 1, when the alternating signal (M) assumes the H level and the alternating signal (MB) assumes the L level, the output of the comparator 140 corresponding to the drain signal line (D1) is inputted to the switching element (SWA) and the output of the comparator 140 corresponding to the drain signal line (D2) is inputted to the switching element (SWB). Further, the output voltage of the buffer amplifier (BAA) is inputted to the drain signal line (D1) and the output voltage of the buffer amplifier (BAB) is inputted to the drain signal line (D2).

Further, when the alternating signal (M) assumes the L level and the alternating signal (MB) assumes the H level, the output of the comparator 140 corresponding to the drain signal line (D1) is inputted to the switching element (SWB) and the output of the comparator 140 corresponding to the drain signal line (D2) is inputted to the switching element (SWA). Further, the output voltage of the buffer amplifier (BAB) is inputted to the drain signal line (D1) and the output voltage of the buffer amplifier (BAA) is inputted to the drain signal line (D2).

Accordingly, the polarity of the video signal supplied to the drain signal lines D can be inverted for every horizontal scanning line between the neighboring drain signal lines. In FIG. 1, symbol LS indicates a level shift circuit.

The gate driver 500 is operated in response to the start signal (VST) and the clock signal (CL) transmitted from the timing control circuit 200, and it outputs the scanning signal which sequentially turns on the pixel transistors (GTFT), one after another, for one horizontal scanning line period to the gate signal lines G on the display part 800. Images are displayed on the display part 800 in accordance with such operations.

In this embodiment, since the alternating is performed by the sample holding circuit 150, the ramp voltages (RAMP1, RAMP2) which are outputted from the ramp voltage generating circuit 400 can be held at the positive polarity and the negative polarity without changing the polarity, whereby the voltage amplitude can be decreased and the power consumption can be reduced.

Further, the output impedance of the ramp generating circuit 400 can be reduced, and, hence, the delay time can be shortened, whereby display images of high quality can be obtained.

Figure 2:
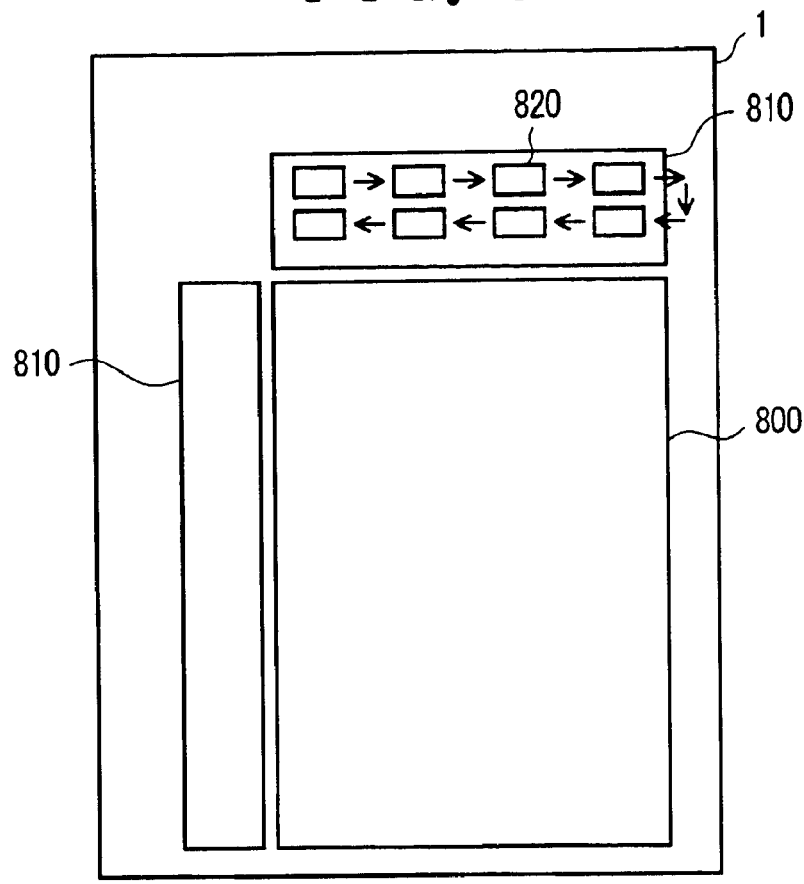
FIG. 2 is a diagram showing a pseudo single crystal region in the liquid crystal display device of the embodiment of the present invention.

FIG. 2 is a diagram showing the pseudo single crystal regions in the liquid crystal display device of this embodiment. As shown in FIG. 2, in this embodiment, peripheral circuits 810 are arranged around the periphery of the display part 800; and, the drain driver 100, the timing control circuit 200, the reference data generating circuit 300, the ramp voltage generating circuit 400 and the gate driver 500 are arranged in the peripheral circuits 810. These circuits are formed of semiconductor layers (above-mentioned pseudo single crystal regions) which are formed on the glass substrate 1.

Figure 11:
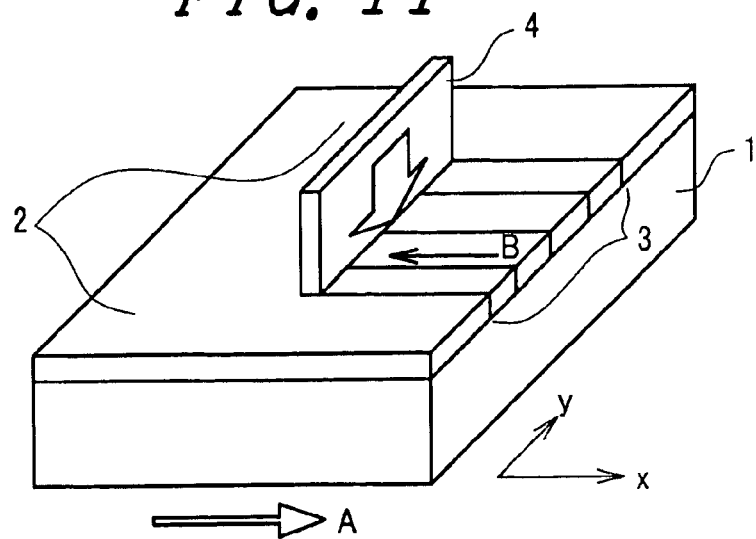
FIG. 11 is a diagram illustrating a pseudo single crystallizing method of forming polycrystal silicon using a laser.
Figure 12:
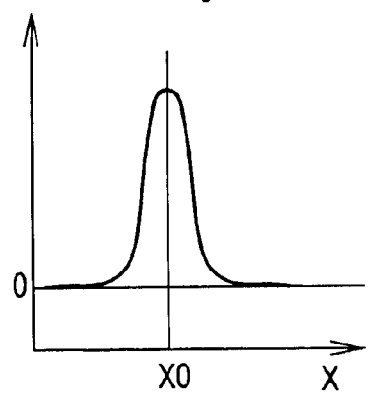
FIG. 12 is a graph showing the intensity of laser beam irradiation in the X direction in the pseudo single crystallizing method of forming polycrystal silicon shown in FIG. 11.
Figure 13:
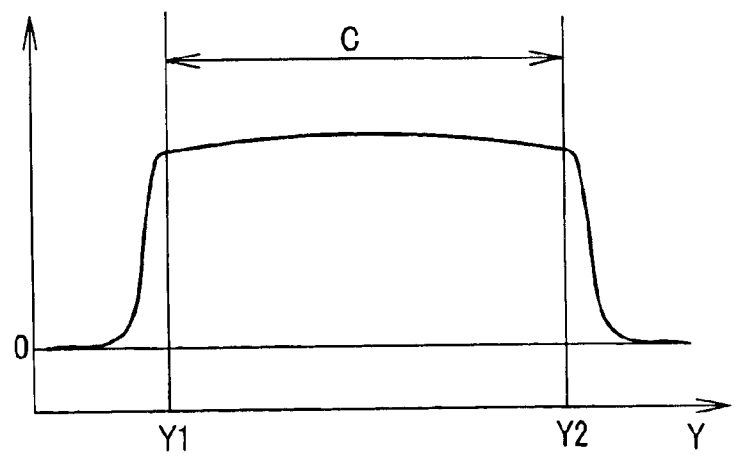
FIG. 13 is a graph showing the intensity of laser beam irradiation in the Y direction in the pseudo single crystallizing method of forming polycrystal silicon shown in FIG. 11.

Here, the above-mentioned pseudo single crystal regions 820 (corresponding to the symbol 3 in FIG. 11) are formed in an island shape in an arrow (→) direction, as shown in FIG. 2. This is because the pseudo single crystal regions 820 are formed by scanning the glass substrate 1 in the direction opposite to the arrow (→) direction shown in FIG. 2. A plurality of thin film transistors are arranged in one pseudo single crystal region 820.

As mentioned previously, when the polycrystal silicon is melted and recrystallized to form a pseudo single crystal region, the state of the recrystallization is changed depending on the difference in the intensity of the laser beam irradiation. Accordingly, when the thin film transistors are formed on the pseudo single crystal region 820, irregularities arise in the characteristics (for example, mobility or the like) of the thin film transistors for every pseudo single crystal region 820.

To address this problem, in this embodiment, a plurality of thin film transistors, which are required to have small irregularities as characteristics of the thin film transistors, are formed within the same pseudo single crystal region. That is, for example, a differential pair of transistors of a differential amplifying circuit, or a pair of transistors which constitute a current mirror circuit or the like, are formed on the same pseudo single crystal region. Due to such a constitution, it is possible to reduce the irregularities of the characteristics of the thin film transistors.

Figure 3:
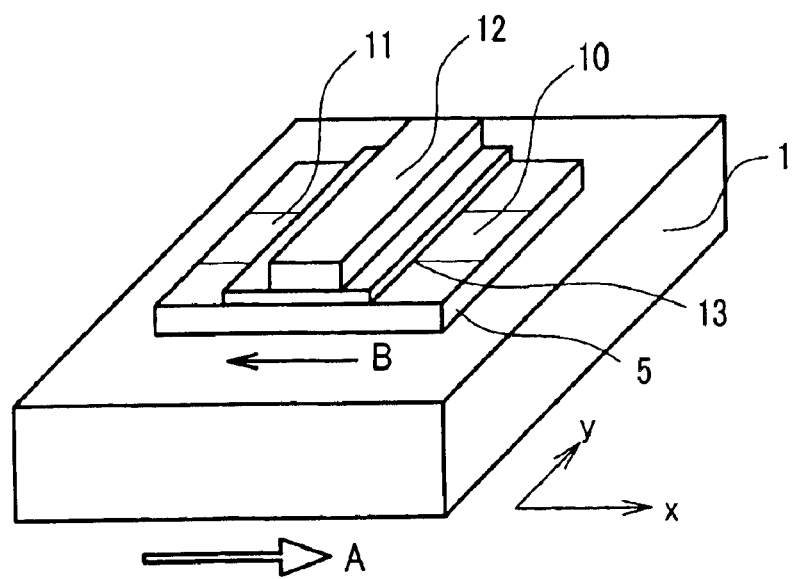
FIG. 3 is a diagrammatic perspective view showing a thin film transistor formed in the pseudo single crystal region.

FIG. 3 is a diagram which schematically shows the thin film transistors formed in the pseudo single crystal region.

The thin film transistor shown in FIG. 3 is formed such that the pseudo single crystal region 820 is formed into a smaller island-like region 5 by etching or the like, a gate oxide film 13 is formed on the region 5, and a gate electrode 12 is formed on the gate oxide film 13. A plurality of regions 5 are formed in one pseudo single crystal region 820, and, hence, a plurality of thin film transistors are formed in one pseudo single crystal region 820. Here, in FIG. 3, numeral 10 indicates a source region, numeral 11 indicates a drain region, an arrow A indicates the scanning direction on the glass substrate 1, and an arrow B indicates the crystallization direction.

With respect to the thin film transistors which are formed on the pseudo single crystal region 820 that has been formed in an island shape, to obtain the favorable mobility, it has been known to arrange the direction of the source-drain (direction of the length of the gate) substantially parallel to the crystal growth direction (direction of the arrow B in FIG. 3). In this case, the thin film transistors may be arranged such that the direction of the length of the gate is disposed at an inclination within ±20 degrees with respect to the longitudinal direction of the crystals.

Hereinafter, the method of arrangement of a plurality of thin film transistors, which are required to have small irregularities as characteristics of the thin film transistors according to this embodiment, will be explained by taking a pair of thin film transistors as an example.

Figure 4:
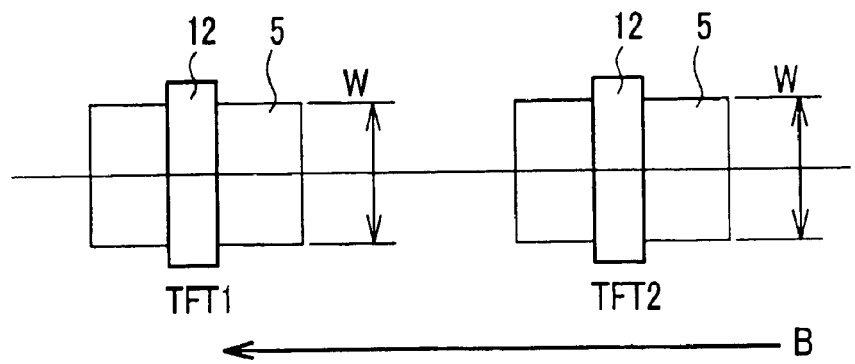
FIG. 4 is a diagram illustrating a method of arrangement of thin film transistors in the embodiment of the present invention.

FIG. 4 is a diagram showing a method of arranging thin film transistors according to this embodiment.

As shown in FIG. 4, in this embodiment, not only are the source-drain direction of respective thin film transistors (TFT1, TFT2) arranged substantially parallel (within ±20 degrees) to the crystal growth direction (direction of the arrow B shown in FIG. 4), but also a straight line which connects the centers of the gate widths (V) of the respective thin film transistors (TFT1, TFT2) is arranged to be parallel to the crystal growth direction.

By adopting such an arrangement, the pair of transistors (TFT1, TFT2) are formed in the portion of the pseudo single crystal region which is melted with the same laser beam intensity irradiation and thereafter recrystallized, and, hence, it is possible to obtain favorable matching of the transistor characteristics by reducing the irregularities of the characteristics of the thin film transistors. Here, in this embodiment, it is not always necessary to arrange the straight line which connects the centers of the gate widths (W) of the respective thin film transistors (TFT1, TFT2) to be parallel to the crystal growth direction.

Figure 5:
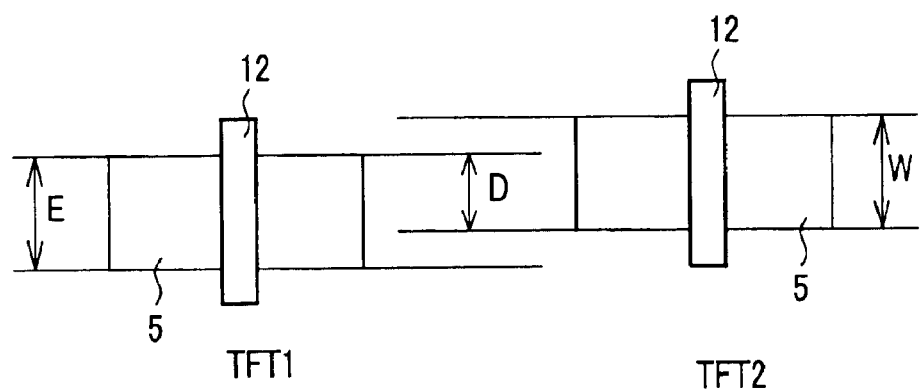
FIG. 5 is a diagram illustrating a method of arrangement of thin film transistors in the embodiment of the present invention.

As shown in FIG. 5, two or more thin film transistors (TFT1, TFT2), which are required to have small irregularities as characteristics of the thin film transistors, are arranged such that the direction of the length of the gates of the respective thin film transistors is inclined within ±20 degrees with respect to the longitudinal direction of the crystals which are grown in a strip shape. At the same time, these thin film transistors (TFT1, TFT2) may be also arranged such that a first region, which is formed by imaginarily extending the channel region of the thin film transistor (TFT1), having the gate width (E), in parallel to the growth direction of the strip-like grown crystal, and a second region, which is formed by imaginarily extending the channel region of the thin film transistor (TFT2), having the gate width (W), in parallel to the growth direction of the strip-like grown crystal, have at least portions thereof which are superposed on each other.

Here, the extent to which such portions are superposed is 50% or more, and preferably 80% or more. That is, it is desirable that the length of D shown in FIG. 5 is 50% or more, and preferably 80% or more, of the gate width (W) of the thin film transistor (TFT2). In addition to the above-mentioned features, it is further desirable in this embodiment that these thin film transistors (TFT1, TFT2) are arranged in the inside of the same pseudo single crystal region 820 of the plurality of pseudo single crystal regions 820. The same goes for the embodiments that will be explained hereinafter.

Figure 6:
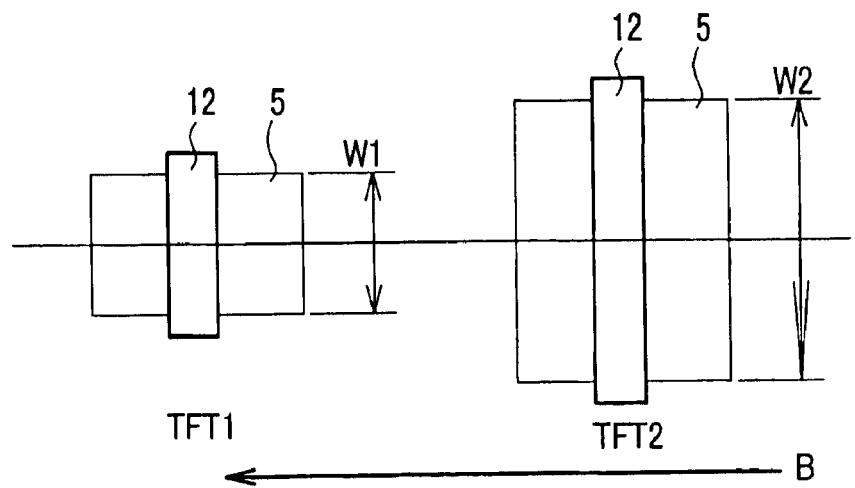
FIG. 6 is diagram illustrating another example of a method of arrangement of thin film transistors in the embodiment of the present invention.

FIG. 6 is a diagram showing another example of the method of arrangement of thin film transistors according to this embodiment. The example shown in FIG. 6 is directed to a method of arrangement in which the irregularities of the characteristics of two thin film transistors (TFT1, TFT2) which differ in the gate width (W1, W2) can be decreased.

Also, in this embodiment, not only is the source-drain direction set to be substantially parallel to the crystal growth direction (arrow direction B shown in FIG. 6), but also a straight line which connects the centers of the gate widths (W1, W2) is arranged parallel to the crystal growth direction.

This example is particularly effective when the gate width is sufficiently smaller than a long side of the laser beams. This is because the distribution of the laser beam intensity substantially approximates a straight line in the narrow width region; and, hence, the correlation between the characteristics of the thin film transistor and the crystallized state at the center of the gate width can be established.

Figure 7:
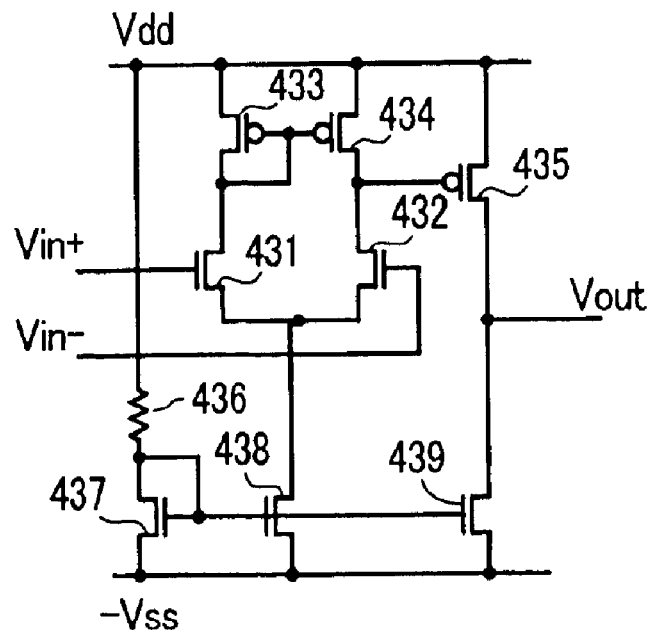
FIG. 7 is a schematic circuit diagram showing a differential amplifying circuit to which the method of arrangement of the thin film transistor in the embodiment of the present invention is applied.

FIG. 7 is a circuit diagram showing a differential amplifying circuit to which the method of arrangement of the thin film transistors of this embodiment is applied.

In FIG. 7, N-type MOS transistors 431, 432 (simply referred to as NMOS transistors hereinafter) are differential-pair thin film transistors which constitute a differential pair. Further, P-type MOS transistors 433, 434 (simply referred to as PMOS transistors hereinafter) are provided as a pair of thin film transistors which constitute an active load circuit, and PMOS435 is a transistor having a gate to which an output of the active load circuit is applied. Further, the NMOS transistors 437, 438 or the NMOS transistors 437, 439 are provided as pairs of thin film transistors which constitute respective current mirror circuits.

Figure 8:
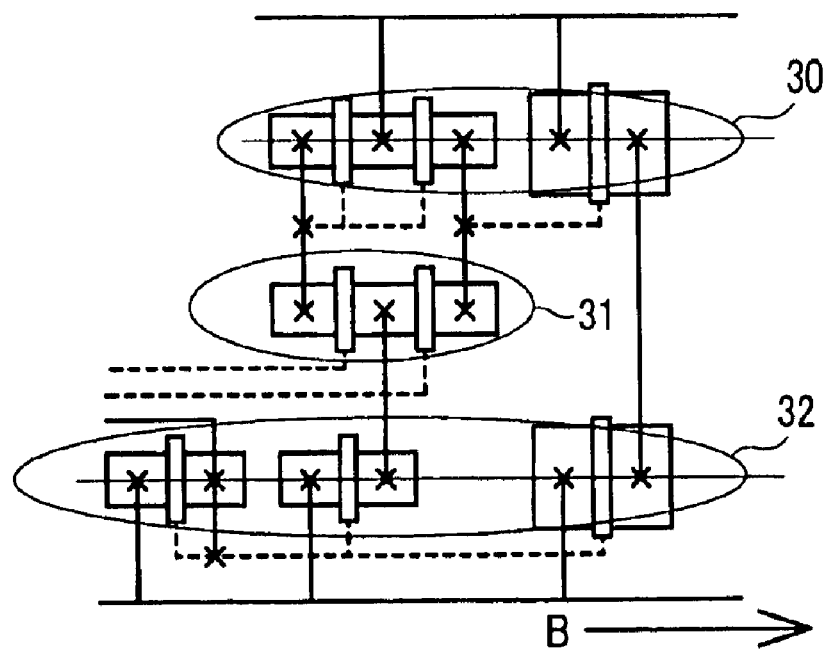
FIG. 8 is a diagram showing a first example of the layout of the differential amplifying circuit shown in FIG. 7.

FIG. 8 is a diagram showing a first example of a layout of the differential amplifying circuit shown in FIG. 7.

Portions surrounded by an ellipse 30 in FIG. 8 are regions in which the PMOS transistors 433, 434, 435 shown in FIG. 7 are arranged, wherein respective thin film transistors are arranged such that a line which connects the centers of the gate widths of the respective thin film transistors is substantially arranged in parallel to the crystallizing direction.

Further, a portion surrounded by an ellipse 31 in FIG. 8 is a region in which the NMOS transistors 431, 432 shown in FIG. 7 are arranged, wherein respective thin film transistors are arranged such that a line which connects the centers of the gate widths of the respective thin film transistors is substantially arranged in parallel to the crystallizing direction.

In the same manner, a portion surrounded by an ellipse 32 in FIG. 8 is a region in which the NMOS transistors 437 to 439 shown in FIG. 7 are arranged, wherein respective thin film transistors are arranged such that a line which connects the centers of the gate widths of the respective thin film transistors is substantially arranged in parallel to the crystallizing direction.

Here, the PMOS transistor 435 and the NMOS transistor 439 have the gate width thereof set to a value which is twice as large as the gate width of the other transistors. Further, all thin film transistors shown in FIG. 8 are arranged inside of the same pseudo single crystal region 820.

Figure 9:
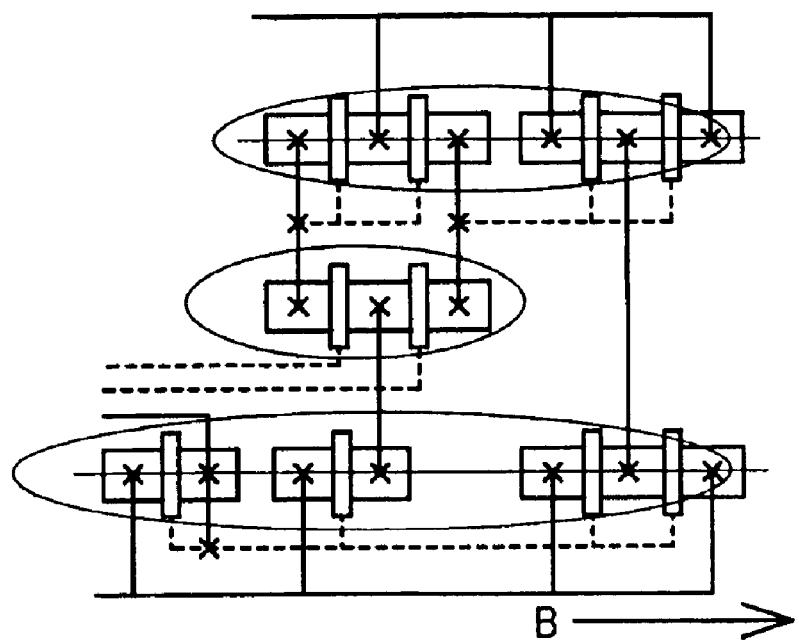
FIG. 9 is a diagram showing a second example of the layout of the differential amplifying circuit shown in FIG. 7.

FIG. 9 is a diagram showing a second example of a layout of the differential amplifying circuit show in FIG. 7. What makes this example different from the example shown in FIG. 8 lies in the method of layout the PMOS transistor 435 and the NMOS transistor 439. In the example shown in FIG. 9, two transistors having the same gate width as the width of the other transistors are used in place of each of these two transistors, so as to increase the current (source-drain current) capacity by twice.

Figure 10:
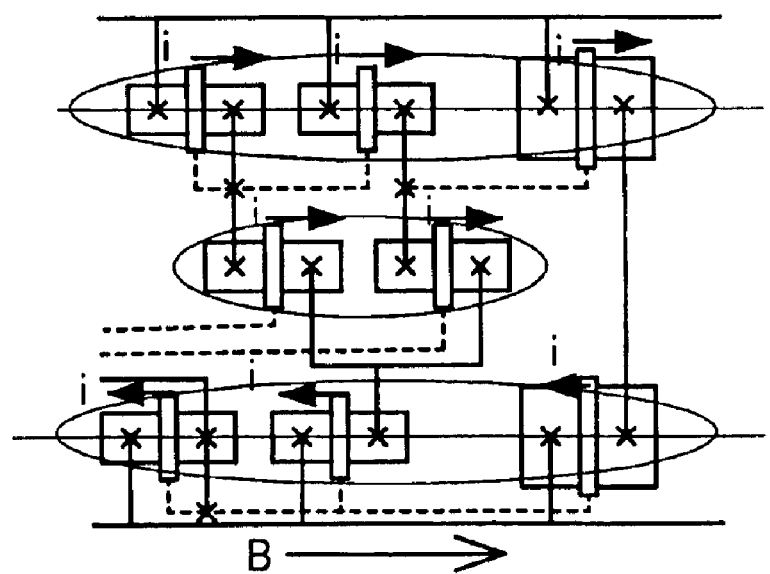
FIG. 10 is a diagram showing a third example of the layout of the differential amplifying circuit shown in FIG. 7.

FIG. 10 is a diagram showing a third example of the layout of the differential amplifying circuit shown in FIG. 7.

What makes this example differ from the example shown in FIG. 8 lies in the fact that the directions of currents which flow in respective transistors (source-drain currents "i" shown in FIG. 10) are aligned with each other. Due to such a layout, it is possible to decrease the irregularities of the characteristics of the thin film transistors, and, hence, the matching property of a transistor pair can be enhanced.

Here, in FIG. 8 to FIG. 10, x indicates through holes (contact holes) while a dotted line indicates a wiring layer formed as a lower layer. As explained above, in accordance with this embodiment, a plurality of thin film transistors, which are required to have small irregularities as characteristics of the thin film transistors, for example, a pair of transistors, are arranged such that the gate widths of the pair transistors are set to be equal; and, at the same time, the straight line which connects the centers of the gate widths become parallel to the crystallizing direction of the pseudo single crystal region.

As a result, the distribution of the intensity of the laser beams irradiated to the channel regions of the pair of transistors becomes equal, and, hence, the relative error in the characteristics of the pair of transistors can be decreased.

Further, even when the matching of transistors which differ in gate width is acquired using the current mirror circuit, the pair of transistors are arranged such that the straight line which connects the centers of the gate widths becomes parallel to the crystallizing direction. As a result, the average value of the intensity of laser beams in the gate width direction can be made equal, and, hence, the relative error in the characteristics of the pair of transistors can be decreased.

Further, when a current ratio of an integer times is ensured by the current mirror circuit, for example, using a transistor having a gate width which is equal to the refer nce width and transistors having the same gate width which are an integer times larger than the former transistor in number, all of these transistors are arranged such that the straight line which connects the centers of the gate widths becomes parallel to the crystallizing direction. As a result, the distribution of the intensity of laser beams irradiated to the channel regions of the pair of transistors becomes equal, and, hence, the relative error in the characteristics of the pair of transistors can be decreased.

Here, it is possible to combine these embodiments with the modifications which were explained in conjunction with FIG. 5.

Due to such constitutions, according to the display device of this embodiment, since the reference voltage generating circuit which supplies the reference voltage to the built-in DAC can be formed on the substrate on which the display part 800 is also formed, it is possible to reduce the number of exteriorly mounted parts, whereby it is possible to provide a highly reliable display device.

Further, since the buffer amplifiers of the drain driver can be formed on the substrate on which the display part 800 is formed, it is possible to produce a display of high quality by use in a line sequential driving method.

Here, although the present invention has been explained in conjunction with embodiments which are directed to a liquid crystal display module, it is needless to say that the present invention is not limited to these embodiments, and the present invention is applicable to other display devices, such as an EL display device, or to semiconductor devices in general.

Although the present invention has been specifically explained based on the above-mentioned embodiments, it is needless to say that the present invention is not limited to these embodiments, and that various modifications are conceivable without departing from the gist of the present invention.

A summary of the advantageous effect obtained by the invention disclosed in this specification is as follows.

In the display device according to the present invention, it is possible to reduce irregularities in the characteristics of a pair of transistors which are formed using the pseudo single crystallizing technique and which are used in a differential amplifying circuit or the like.

What is claimed is:

1. A display device comprising:

a substrate; and a plurality of thin film transistors, wherein each of the thin film transistors includes a pseudo single crystal regions grown in an elongate strip-like shape in a direction parallel to the substrate, and of the plurality of thin film transistors, two or more thin film transistors, which are required to exhibit small irregularities relative to each other as characteristics of the transistors, have the direction of the length of gates of the respective thin film transistors arranged with an inclination of within ±20 degree with respect to the longitudinal direction of the strip-like grown crystals, and are arranged such that, when channel regions of the respective thin film transistors are imaginarily extended in parallel to the growth direction of the strip-like grown crystals, at least portions of the channel regions are superposed on each other.

2. A display device according to claim 1, wherein an extent of superposition of the channel regions is 50% or more.

3. A display device according to claim 2, wherein an extent of extent of superposition of the channel regions is 80% or more.

4. A display device according to claim 1, wherein two or more thin film transistors, which are required to exhibit small irregularities relative to each other as characteristics of the transistors, are formed of a differential pair of transistors which constitute a differential amplifying circuit.

5. A display device according to claim 1, wherein two or more thin film transistors, which are required to exhibit small irregularities relative to each other as characteristics of the transistors, are formed of a pair of transistors of an active load circuit which constitutes a differential amplifying circuit.

6. A display device according to claim 1, wherein two or more thin film transistors, which are required to exhibit small irregularities relative to each other as characteristics of the transistors, are formed of a pair of transistors of an active load circuit which constitutes a differential amplifying circuit and a transistor having a gate thereof to which an output voltage of the active load circuit is applied.

7. A display device according to claim 1, wherein two or more thin film transistors, which are required to exhibit small irregularities relative to each other as characteristics of the transistors, are formed of a pair of transistors which constitute a current mirror circuit.

8. A display device according to claim 1, wherein two or more thin film transistors, which are required to exhibit small irregularities relative to each other as characteristics of the transistors, are connected in parallel to each other thus equivalently constituting one transistor.

9. A display device according to claim 1, wherein the plurality of thin film transistors are formed on a flat surface.

* * * * *